(12) United States Patent
Gollier et al.

(10) Patent No.: US 8,754,434 B1
(45) Date of Patent: Jun. 17, 2014

(54) FLEXIBLE HERMETIC THIN FILM WITH LIGHT EXTRACTION LAYER

(71) Applicants: Jacques Gollier, Painted Post, NY (US); Glenn Eric Kohnke, Corning, NY (US); Mark Alejandro Quesada, Horseheads, NY (US); James Andrew West, Painted Post, NY (US)

(72) Inventors: Jacques Gollier, Painted Post, NY (US); Glenn Eric Kohnke, Corning, NY (US); Mark Alejandro Quesada, Horseheads, NY (US); James Andrew West, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/751,638

(22) Filed: Jan. 28, 2013

(51) Int. Cl.
*H01L 21/00* (2006.01)

(52) U.S. Cl.
USPC .................. 257/98; 257/89; 257/99; 257/434

(58) Field of Classification Search
USPC .......... 257/12–13, 27, 66, 69, 72, 79, 88, 89, 257/98–100, 431–433, 347, 344; 313/112, 313/501, 503, 506
See application file for complete search history.

(56) References Cited

U.S. PATENT DOCUMENTS

| | | | |
|---|---|---|---|
| 2003/0117071 A1* | 6/2003 | Lee et al. | 313/512 |
| 2005/0127829 A1* | 6/2005 | Takahashi | 313/504 |
| 2007/0262705 A1* | 11/2007 | Fukuda et al. | 313/504 |
| 2009/0058268 A1* | 3/2009 | Yoshida et al. | 313/504 |
| 2010/0019664 A1* | 1/2010 | Mishima | 313/504 |

* cited by examiner

*Primary Examiner* — Dung A. Le
(74) *Attorney, Agent, or Firm* — Ryan T. Hardee

(57) ABSTRACT

A protected organic light emitting diode includes an organic light emitting diode structure formed on a substrate, a hermetic barrier layer formed over at least part of the organic light emitting diode structure, and a light extraction layer. The barrier layer may include a glass material such as a tin fluorophosphate glass, a tungsten-doped tin fluorophosphate glass, a chalcogenide glass, a tellurite glass, a borate glass or a phosphate glass. The light extraction layer, which may be formed over the barrier layer, includes a high refractive index matrix material and at least one of scattering particles dispersed throughout the matrix material and a roughened surface.

23 Claims, 5 Drawing Sheets

US 8,754,434 B1

FLEXIBLE HERMETIC THIN FILM WITH LIGHT EXTRACTION LAYER

BACKGROUND

The present disclosure relates generally to organic light emitting diodes (OLEDs) and display devices that include OLEDs. Contemplated display devices include, but are not limited to, light sources, image displays, visual indicators, and other devices that utilize one or more light sources to fulfill their function.

Although OLED devices can efficiently generate light, much of the light that is produced is not transmitted but remains trapped within the device. In many conventional devices, 25% or less of the light produced emanates from the device while 75% or more of the light is trapped within the device (45% or more trapped within the device's organic layers, and 30% or more trapped within inorganic layers, i.e., glass substrate). A schematic illustration of a bottom-emission OLED device, where light emission occurs through the substrate, is shown in FIG. 1A. A schematic illustration of a top-emission OLED device is shown in FIG. 1B. Each device includes a top electrode 2, one or more active layers 4, and a bottom electrode 6 formed over a supporting substrate 10. In a bottom-emission device, the bottom electrode may be transparent, while in a top-emission device, the top electrode may be transparent. The arrows in each figure depict the direction of light emission.

In view of the foregoing, one aspect of the present disclosure relates to improving the light transmission of organic light emitting diodes. A further aspect of the present disclosure relates to protecting organic light emitting diodes from adverse reactions with air and/or moisture, thus extending their lifetime. The technology of the present disclosure can be used to enhance the performance of organic light emitting diodes.

SUMMARY

Disclosed herein are materials and systems that can be used to form a transparent and/or translucent barrier layer that cooperates with a light extraction layer to both protect and enhance the function of light-emitting devices such as organic light emitting diodes (OLEDs). The barrier layer is a thin, impermeable and mechanically robust layer that can be formed immediately adjacent to the device. In one embodiment, a separate light extraction layer can be formed over the barrier layer. In a further embodiment, a light extraction layer can be incorporated into at least a portion of the barrier layer.

The barrier layer is formed from an inorganic, glass material such as a tin fluorophosphate glass, tungsten-doped tin fluorophosphate glass, chalcogenide glass, tellurite glass, borate glasses, phosphate glasses or combinations thereof. The scattering layer may be a composite layer that includes both a high refractive index matrix material and optically transparent particles that are incorporated into and throughout the matrix. The matrix material may comprise a polymeric material or an inorganic, glass material. Particles within the matrix material can induce scattering of photons that pass into the scattering layer.

In addition to or in lieu of providing bulk scattering via embedded particles, the scattering layer may include a structured surface, such as near-surface roughness, that can provide surface scattering. Thus, the light extraction layer according to particular embodiments comprises a matrix material and a scattering layer, where the scattering layer is selected from the group consisting of scattering particles dispersed throughout the matrix material and a roughened surface. The device can be formed on a flexible substrate.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention and together with the description serve to explain the principles and operations of the invention.

DETAILED DESCRIPTION

An organic light emitting diode is protected by a hermetic barrier layer that is formed over the device. A light extraction layer is provided in conjunction with the barrier layer. In embodiments, the barrier layer is an inorganic layer and the light extraction layer comprises a composite layer that includes a high refractive index matrix material and one or both of (a) scattering particles dispersed throughout the matrix material and (b) a roughened surface. A flexible device can include a single hermetic barrier layer. The barrier layer is adapted to prevent or inhibit the ingress of oxygen or moisture to the underlying device. The light extraction layer is adapted to obviate or significantly inhibit the phenomenon of total internal reflection within the barrier layer and, with it, the attendant light trapping during operation of the device. Volumetric and/or surface scattering introduced by the light extraction layer can, in embodiments, enhance the output power from an OLED device by a factor of 2 or 3 or more.

The barrier layer may comprise a glass material selected from the group consisting of tin fluorophosphate glasses, tungsten-doped tin fluorophosphate glasses, chalcogenide glasses, tellurite glasses, borate glasses and phosphate glasses. The matrix material for the light extraction layer may comprise the inorganic barrier layer or, alternately, a high refractive index inorganic or organic layer such as zirconium oxide or polyethylene terephalate (PET). Additional suitable matrix materials are disclosed herein. The scattering particles may include transparent, inorganic particles that comprise a material having a refractive index that is different than the refractive index of the matrix material.

In embodiments, active layers of the OLED may be formed on a flexible substrate. An example flexible substrate material is polyethylene terephalate (PET) optionally planarized with a thin PMMA film. In embodiments, a barrier layer is formed immediately adjacent to the OLED active layers. The combination of the barrier layer and the light extraction layer is lightweight, flexible, resilient, and is resistant to cracking and delaminating.

Figure 1A:
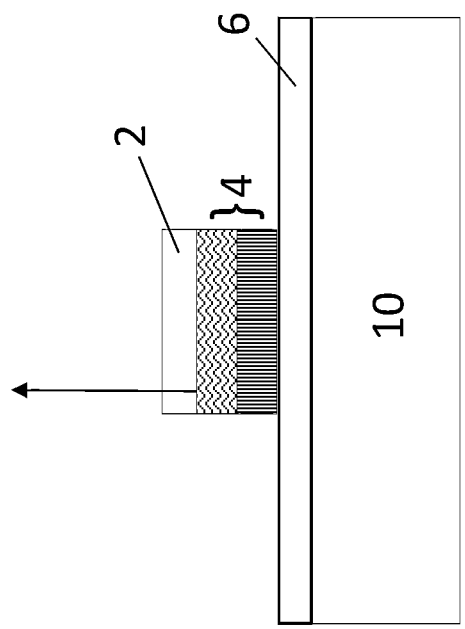
FIG. 1 is a schematic of (A) a bottom-emission OLED device, and (B) a top-emission OLED device according to various embodiments.
Figure 1B:
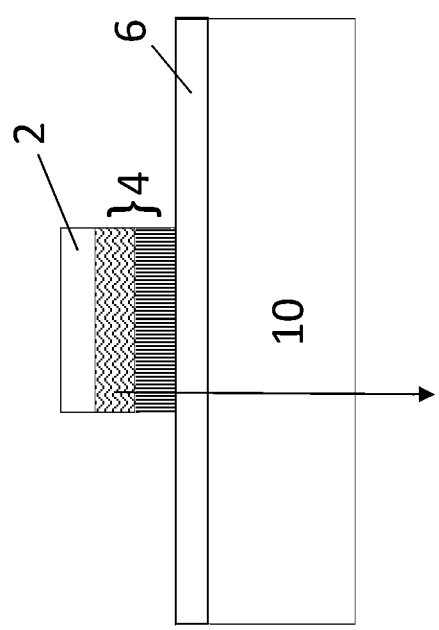
Figure 2:
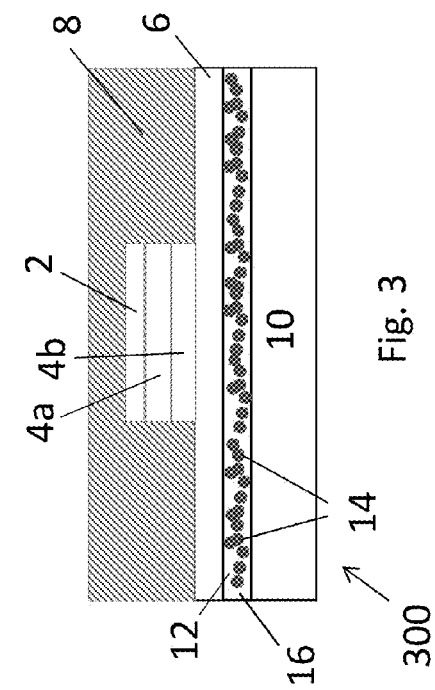
FIG. 2 is a schematic of a top-emission OLED device according to an embodiment.

FIG. 2 illustrates an example embodiment of a top-emission OLED device according to one embodiment. The OLED device 200, which includes active layers 4 such as electron transport layer 4a and hole transport layer 4b and opposing electrodes 2 and 6 such as top electrode 2 and bottom electrode 6 is formed on a supporting substrate 10. A barrier layer 8 and a light extraction layer 12 are successively formed over the OLED device. In the illustrated embodiment, the barrier layer is in direct physical contact with the OLED device and the light extraction layer is in direct physical contact with the barrier layer. The light extraction layer 12 includes a plurality of scattering particles 14 embedded in a high refractive index matrix material 16.

Figure 3:
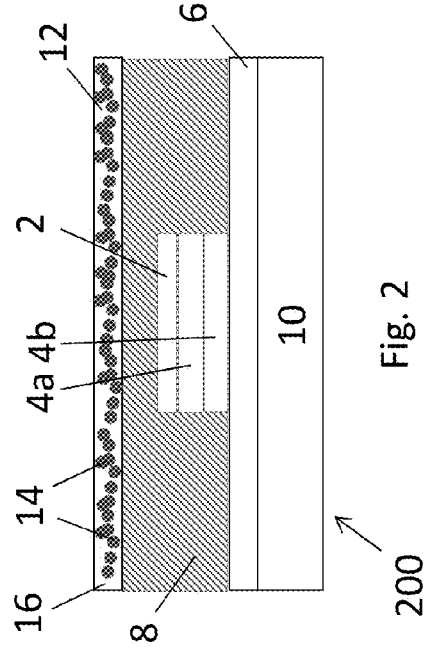
FIG. 3 is a schematic of a bottom-emission OLED device according to an embodiment.

FIG. 3 shows an example embodiment of a bottom-emission OLED structure 300. A light extraction layer 12 is formed between an OLED device structure and a supporting substrate 10, and a barrier layer 8 is formed over the OLED device structure on one side of the substrate 10. The light extraction layer includes matrix material 16 and scattering particles 14 dispersed throughout the matrix material. In the illustrated bottom-emission structure, the bottom electrode 6 can be a transparent electrode such as an electrode comprising indium tin oxide (ITO).

Figure 4:
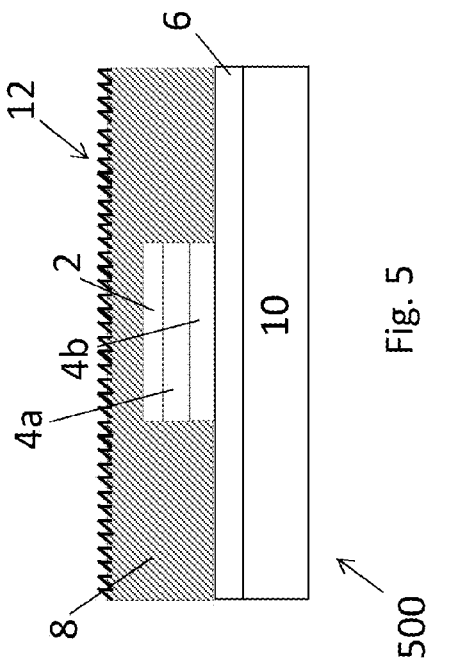
FIG. 4 is a schematic of a top-emission OLED device according to a further embodiment.

A variant of the top-emission device of FIG. 2 is shown in FIG. 4. The device 400 includes a barrier layer 8 formed over the device substrate. In the FIG. 4 embodiment, the barrier layer comprises a high refractive index inorganic material (e.g., glass material) and a plurality of scattering particles 14 are dispersed throughout the barrier layer. As illustrated, the barrier layer, which adapted to also serve a light extraction function, can be in direct physical contact with the OLED device.

Figure 5:
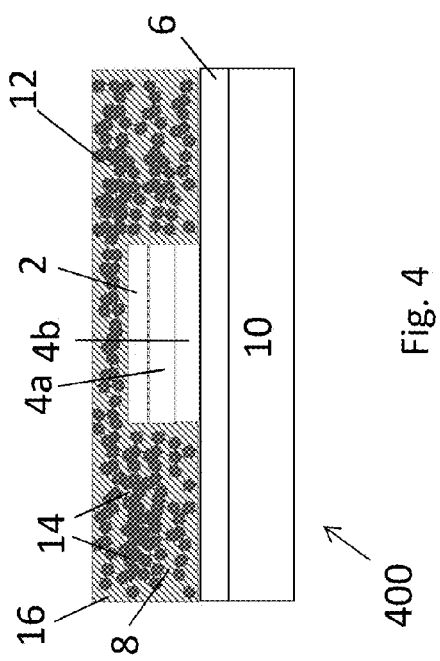
FIG. 5 is a schematic of a top-emission OLED device according to a still further embodiment.

FIG. 5 illustrates a further example embodiment of a top-emission OLED structure. In the FIG. 5 embodiment, the light extraction layer 12 is formed by roughening the free surface of the barrier layer 8.

In various embodiments, the barrier layer is transparent and/or translucent, thin, flexible, impermeable, "green," and configured to form hermetic seals. In embodiments, the barrier layer is an inorganic layer and is free of fillers and/or binders. Further, the materials used to form the inorganic layer are not frit-based or powders formed from ground glasses. In further embodiments, the light extraction layer is transparent and/or translucent, thin, flexible, and configured to adhere to the barrier layer.

In embodiments, a low melting temperature glass can be used to form the barrier layer. As used herein, a low melting temperature glass has a softening point less than 500° C., e.g., less than 500, 400, 350, 300, 250 or 200° C. In embodiments where the barrier layer comprises a glass material, such glass can have a glass transition temperature of less than 400° C. (e.g., less than 400, 350, 300, 250, or 200° C.).

Exemplary materials that can form the barrier layer can include copper oxides, tin oxides, silicon oxides, tin phosphates, tin fluorophosphates, chalcogenide glasses, tellurite glasses, borate glasses, and combinations thereof.

Example compositions of suitable tin fluorophosphate glasses, for example, include: 20-75 wt. % tin, 2-20 wt. % phosphorus, 10-46 wt. % oxygen, 10-36 wt. % fluorine, and 0-5 wt. % niobium. An example tin fluorophosphate glass includes: 22.42 wt. % Sn, 11.48 wt. % P, 42.41 wt. % O, 22.64 wt. % F and 1.05 wt. % Nb. Example tungsten-doped tin fluorophosphate glasses include: 55-75 wt. % tin, 4-14 wt. % phosphorus, 6-24 wt. % oxygen, 4-22 wt. % fluorine, and 0.15-15 wt. % tungsten. Further example inorganic layer compositions, expressed in terms of mole percent of the constituent oxides, include 20-100% SnO, 0-50% $SnF_2$, 0-30% $P_2O_5$ and as optional additions 0-10% $WO_3$ or 0-5% $Nb_2O_5$. Still further example inorganic layer compositions include 20-100% SnO, 0-50% $SnF_2$, 0-30% $B_2O_3$ and as optional additions 0-10% $WO_3$ or 0-5% $Nb_2O_5$.

Additional aspects of suitable low melting temperature glass compositions and methods used to form glass layers from these materials are disclosed in commonly-assigned U.S. Pat. Nos. 8,115,326, 5,089,446, 7,615,506, 7,722,929, 7,829,147 and commonly-assigned U.S. Patent Application Publication Nos. 2007/0040501 and 2012/0028011 the entire contents of which are incorporated by reference herein.

The inorganic barrier layer material may be deposited by, for example, sputtering, co-evaporation, laser ablation, flash evaporation, spraying, pouring, vapor-deposition, dip-coating, painting or rolling, spin-coating, or any combination thereof. A suitable workpiece can include an OLED device such as an OLED device formed on a flexible substrate.

By way of example, the barrier layer can be formed via room temperature sputtering of one or more suitable low melting temperature (LMT) glass materials or precursors for these materials. A description of a single-chamber sputter deposition apparatus for forming the barrier layer is provided in commonly-assigned U.S. patent application Ser. No. 13/660,717, the entire contents of which are incorporated by reference herein. In embodiments, a thickness (i.e., as-deposited thickness) of the barrier layer can range from about 10 nm to 50 microns (e.g., about 0.01, 0.02, 0.05, 0.1, 0.2, 0.5, 1, 2, 3, 5, 10, 20 or 50 microns).

Defects such as pinholes in the barrier layer can be eliminated though a consolidation step (for example, exposure to moisture treatment), to produce a pore-free, gas and moisture impenetrable protective layer. An optional heat treatment step may be performed in a vacuum, or in an inert atmosphere, or under ambient conditions depending upon factors such as the composition of the inorganic material.

Various thermal, mechanical, optical and electrical properties of two representative barrier layer compositions are summarized in Table 1 together with corresponding data for high purity fused silica. Expressed in terms of mole percent of the constituent oxides, composition 1 is a niobium-doped tin fluorophosphate glass comprising 32.1% SnO, 32.9% $SnF_2$, 33.3% $(NH_4)H_2PO_4$ and 1.6% $Nb_2O_5$, and composition 2 is a tin fluorophosphate glass comprising 80% SnO and 20% $P_2O_5$.

TABLE 1

Properties of example inorganic barrier layer materials.

| Property | Comp. 1 | Comp. 2 | Fused Silica |
|---|---|---|---|
| Thermal conductivity (W/mK) | 0.31 | 0.29 | 1.30 |
| Mass density (g/cm³) | 4.2 | 4.2 | 2.2 |
| Specific heat at 30° C. (J/gK) | 0.37 | 0.36 | 0.78 |

TABLE 1-continued

Properties of example inorganic barrier layer materials.

| Property | Comp. 1 | Comp. 2 | Fused Silica |
|---|---|---|---|
| Thermal diffusivity (mm$^2$/sec) | 0.20 | 0.19 | 0.75 |
| Emissivity | 0.65 | 0.75 | 0.8 |
| CTE (ppm/° C.) | 16-18 | 13-15 | 0.5 |
| Young's modulus (GPa) | 35 | — | 72.7 |
| Refractive index (450-700 nm) | 1.8 | 1.8 | 1.46 |
| Dielectric constant | 9 | — | 3.8 |

In embodiments, the light extraction layer comprises a matrix material and a scattering layer, the scattering layer selected from the group consisting of scattering particles dispersed throughout the matrix material and a roughened surface.

The light extraction layer can include a polymeric matrix. Suitable polymers for the light extraction layer include transparent thermoplastics such as poly(methyl methacrylate) (PMMA), polyethylene naphthalate (PEN), polyethersulfone (PES), polycarbonate (PC), polyethylene terephthalate (PET), polypropylene (PP), oriented polypropylene (OPP), and the like. The light extraction layer matrix can be formed from a UV-curable resin.

The light extraction layer can comprise an inorganic material matrix. For instance, the matrix can include a low melting temperature glass. In particular embodiments, the light extraction layer comprises at least a portion of the barrier layer. A further example material for the light extraction matrix is magnesium fluoride (MgF$_2$).

In embodiments, a thickness of the light extraction layer can range from about 200 nm to 10 microns (e.g., about 0.2, 0.5, 1, 2, 3, 5 or 10 microns).

The light extraction layer may further comprise a plurality of scattering particles dispersed throughout the matrix material. Scattering particles may be formed, for example, from aluminum oxide, silicon oxide, titanium oxide, zirconium oxide, niobium oxide, zinc oxide, tin oxide or silicon nitride, as well as from combinations thereof. The scattering particles may be formed from an optically transparent material. The plurality of scattering particles may be formed from a single composition, or scattering particles having different compositions may be incorporated into the light extraction layer. The scattering particles may occupy from 1 to 75% by volume of the scattering layer, e.g., about 1, 2, 4, 10, 20, 50 or 75 vol. %.

In embodiments, a difference in the refractive index between the scattering particles and the matrix material is at least 0.001. The particles can function as photon scattering sites due to this finite refractive index contrast. A high refractive index layer (e.g., barrier layer or light extraction layer) has a refractive index of at least 1.4. Example high refractive index layers have a refractive index of about 1.4, 1.5, 1.6, 1.7, 1.8, 1.9 or 2.0. In embodiments, a high refractive index layer can have a refractive index of from 1.4 to 3. The scattering particles can have a refractive index of from 1.4 to 3, e.g., about 1.4, 1.5, 1.6, 1.7, 1.8, 1.9 or 2.0. An average particle size of the scattering particles can range from about 10 nm to about 450 nm, e.g., about 10, 20, 50, 100, 200, 250, 300, 400 or 450 nm.

Volumetric scattering by the light extraction layer can be affected by one or more of (a) a plurality of discrete transparent particles dispersed throughout a matrix material and having a higher or lower refractive index than the matrix, (b) a monolayer or multilayers of transparent particles deposited on the OLED device structure prior to deposition of the barrier layer, (c) transparent microcrystals formed with the light extraction layer via devitrification, (d) bubbles, or (e) depositing a layer of scattering particles between adjacent matrix and/or barrier layers.

In addition to or in lieu of providing bulk scattering via embedded particles, the scattering layer may include a surface structure such as near-surface roughness that can provide surface scattering. Surface roughness may be provided by random or patterned etching of the matrix material (e.g., chemical or dry etching) or by patterned deposition of an additional layer over, for example, a previously-formed barrier layer. A suitable range of surface roughness values for the light extraction layer includes an rms (Rq) surface roughness of at least 50 nm, e.g., 50, 100, 200 or 500 nm.

The substrate on which the device is formed can be a glass, polymer or metal substrate. Example substrate materials may include metals (e.g., aluminum or stainless steel), thermoplastics (e.g., polyethylene naphthalate (PEN), polyethersulfone (PES), polycarbonate (PC), polyethylene terephthalate (PET), polypropylene (PP), oriented polypropylene (OPP), etc.), glasses (e.g., borosilicates) and semiconductors (e.g., gallium nitride). The substrate may be a passive substrate or may include an active device. An example substrate can have a thickness of from 25 microns to 5 mm. It is within the scope of the present disclosure that the device may comprise a flexible substrate such as a substrate that may be used to form a flexible display or in the field of flexible electronics. A flexible glass substrate, for example, can have a thickness of from 25 to 500 microns (e.g., 25, 50, 100, 200 or 500 microns) and a bend radius of as low as 200 microns.

For certain applications, properties of the barrier and light extraction layers can include dimensional stability, surface roughness, matched CTE among the layers, toughness, transparency, thermal capability, and barrier properties and/or hermeticity suitable, for instance, for active matrix display fabrication. In embodiments, the barrier layer and the light extraction layer are each CTE-matched with the device substrate. For example, the absolute value of a difference in the CTE between any two of the barrier layer, the light extraction layer and the substrate can be at most 20 ppm/° C., e.g., at most a CTE difference of 20, 10, 5 or 2×10$^{-6}$/° C. Substrates comprising polymers such as PEN and PET have CTE values of approximately 18×10$^{-6}$/° C. and 17×10$^{-6}$/° C., respectively, which are well-matched with the CTE values of example barrier layer materials as disclosed herein.

Some examples of different devices that can be protected by a barrier layer and a light extraction layer include light-emitting devices (e.g., OLED devices), display devices (e.g., LCD displays), photovoltaic devices, thin-film sensors, and evanescent waveguide sensors. For instance, the substrate may comprise a glass plate infiltrated with phosphor. The major surfaces of the substrate can be unroughened, which may be characterized by an arithmetic surface roughness, Ra, of less than 100 nm, e.g., less than 100, 50, 20 or 10 nm.

The formation of the inorganic barrier layer and the light extraction layer, as well as any optional heat treatment step, can be performed at a relatively low temperature (e.g., less than 500° C. or less than 300° C.) in a vacuum or inert atmosphere. This is done to ensure that a water-free and/or oxygen-free condition is maintained throughout the encapsulation process. This can be especially important for robust, long-life operation of sensitive device components such as organic electronics with minimal degradation.

A hermetic layer is a layer which, for practical purposes, is considered substantially airtight and substantially impervious to moisture. By way of example, the hermetic barrier layer can be configured to limit the transpiration (diffusion) of oxygen through the barrier to less than about $10^{-2}$ cm$^3$/m$^2$/day (e.g., less than about $10^{-3}$ cm$^3$/m$^2$/day), and limit the transpiration (diffusion) of water through the barrier to about $10^{-2}$ g/m$^2$/day (e.g., less than about $10^{-3}$, $10^{-4}$, $10^{-5}$ or $10^{-6}$ g/m$^2$/day).

A flexible layer is a layer capable of exhibiting, without breaking or spalling, a bend radius of less than 1 meter, e.g., less than 1, 0.5, 0.2, 0.1 or 0.05 m. The bend radius of an example substrate (e.g., a flexible glass substrate) can be less than 30, 20, 10, 5, 2 or 1 cm, for example. In further embodiments, the bend radius of a flexible substrate may be less than 1 cm, e.g., less than 1, 0.5, 0.2, 0.1, 0.05 or 0.02 cm. A device comprising a flexible substrate, for example, can reliability operate for up to 200000 bending cycles.

In a test sample comprising a 1 inch×3 inch PEN substrate (Dupont Teonex® Q56A, 500 gauge) provided with a 100 nm layer of ITO formed over the substrate and a 2 micron tin fluorophosphate barrier layer formed over the ITO layer, the resistance of the ITO along the 3 inch length of the sample was about 250Ω. A bend radius of the foregoing structure was determined by monitoring the resistance of the ITO layer as the sample was flexed in a two-point bend test, and a value of the bend radius was correlated to a 10% increase in the resistance. An average bend radius for the 2 micron barrier layer on the PEN substrate was about 12.2±3.5 mm. This bend radius is smaller than the bend radius of foil and epoxy-based OLED structures by about a factor of 4. Both the barrier layer and the ITO layer were deposited by sputtering at room temperature.

Figure 6A:
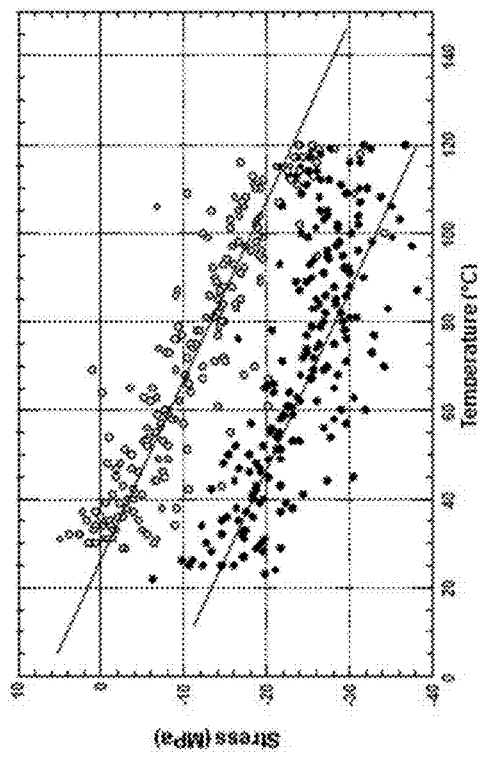
FIGS. 6A and 6B are plots of two successive heating-cooling cycles for a barrier layer formed on a silicon substrate.
Figure 6B:
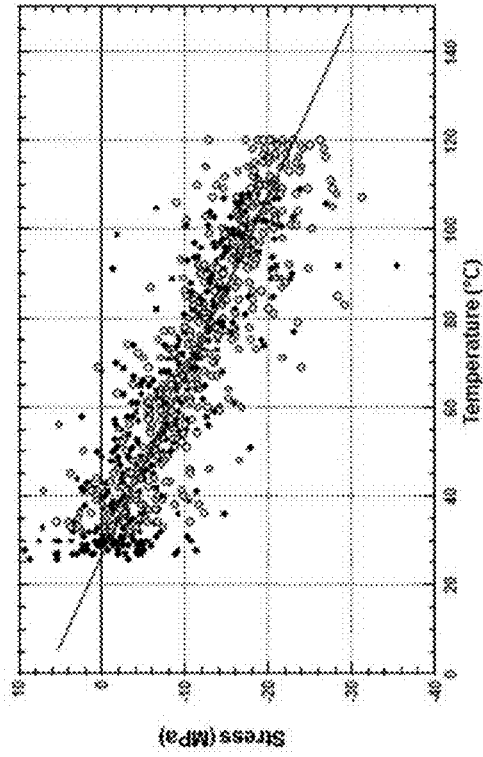

Residual stress in an as-deposited barrier layer can be relieved using a relatively low-temperature post-deposition annealing step. As a result of thermal cycling from about 20° C. to 120° C. (heating and cooling rates of about 0.75° C./min), hysteresis in a 0.5 micron tin fluorophosphate barrier layer formed on a silicon substrate is evident in FIG. 6A, which shows that an initial compressive stress in the barrier layer (−15 MPa) is essentially eliminated after a first thermal cycle. The filled circles correspond to heating cycle data, and the open circles correspond to cooling cycle data. No hysteresis in the stress profile is observed in a second heating/cooling cycle (FIG. 6B). The stress was measured using a KLA Tencor Flexus FLX-2900 wafer stress measurement system.

The light extraction phenomenon associated with the use of the light extraction layer is illustrated with reference to the following example.

A tris(8-hydroxyquinolinato)aluminium (AlQ3) OLED layer was initially deposited on a glass substrate 10, followed by sputter deposition of a niobium-doped tin fluorophosphate glass barrier layer (composition 1). The structure was illuminated with a UV lamp (365 nm) to induce photoluminescence from the AlQ3 layer 9.

To demonstrate that light is trapped in the high refractive index barrier layer and available for extraction, a 20 micron thick light extraction layer was formed over a portion of the barrier layer 8. The light extraction layer included a matrix material of partially stabilized zirconia comprising a plurality of discrete, sub-micron polycrystalline domains 14a. For the demonstration, an index-matching oil layer 15 (n=1.775) was provided at the interface between the barrier layer and the light extraction layer to ensure good optical contact between the layers.

Figure 7B:
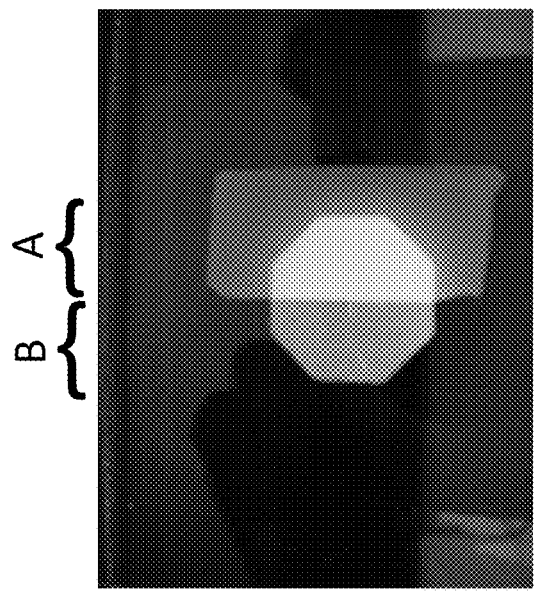
FIG. 7A is a schematic diagram and FIG. 7B is an optical micrograph illustrating light extraction from an example OLED device.
Figure 7A:
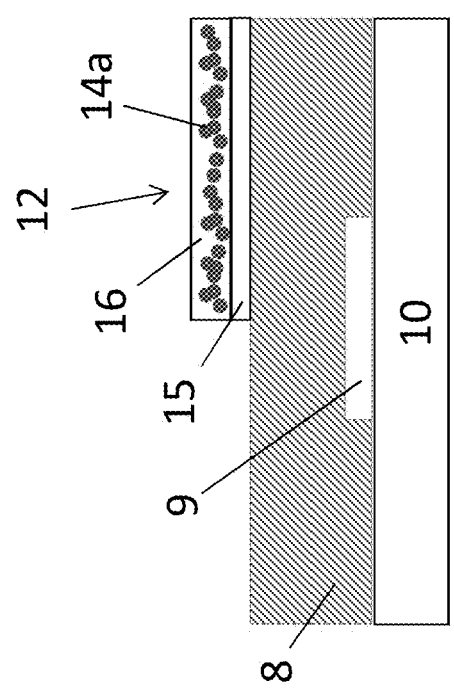

A cross-sectional schematic illustration of the sample is shown in FIG. 7A, and a plan-view photograph of the hexagonally-patterned AlQ3 layer is shown in FIG. 7B. A first region A of the barrier layer is covered by the light extraction layer 12, and a second region B of the barrier layer is uncovered by the light extraction layer 12.

Figure 8:
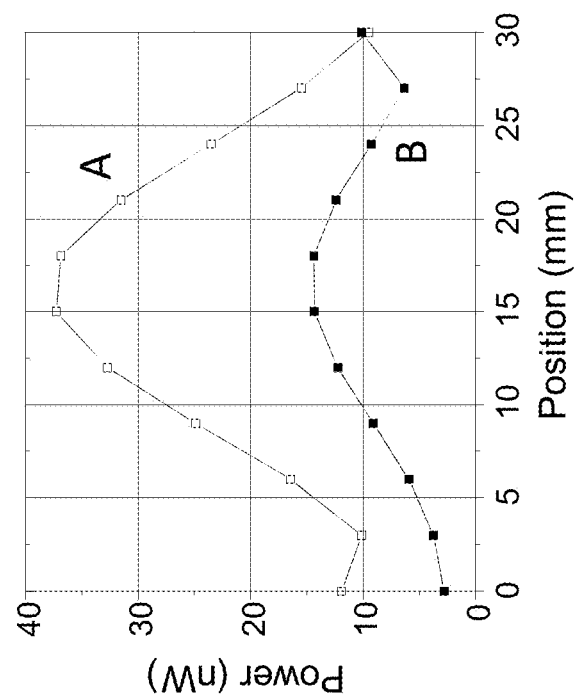
FIG. 8 is a plot of power versus position for OLED devices with and without a light extraction layer.

Quantification of the light extraction was made by scanning a small-aperture photodetector across the emitting surface of the AlQ3. A green filter was used to filter the UV light. The results with and without the light extraction layer are shown in FIG. 8. The measured power output from the covered first region (with the light extraction layer) reaches a maximum of about 37 nW, which is about 260% greater than (2.6×) the power measured from the uncovered second region, which reaches a maximum of about 14 nW.

As disclosed herein, the hermetic barrier layer, in combination with the light extraction layer, can be used to form long-lived, high optical transmission, low power consumption, flexible and efficient OLED devices. The hermetic barrier layer and the light extraction layer may further possess a low elastic modulus and bend radius, high refractive index and transmission in the visible, and, in the case of the barrier layer, a low glass transition temperature, which can be leveraged to modify internal stress within the barrier layer at low processing temperatures.

As used herein, the singular forms "a," "an" and "the" include plural referents unless the context clearly dictates otherwise. Thus, for example, reference to a "layer" includes examples having two or more such "layers" unless the context clearly indicates otherwise.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It is also noted that recitations herein refer to a component being "configured" or "adapted to" function in a particular way. In this respect, such a component is "configured" or "adapted to" embody a particular property, or function in a particular manner, where such recitations are structural recitations as opposed to recitations of intended use. More specifically, the references herein to the manner in which a component is "configured" or "adapted to" denotes an existing physical condition of the component and, as such, is to be taken as a definite recitation of the structural characteristics of the component.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a glass substrate that comprises a glass material include embodiments where a glass substrate consists of a glass material and embodiments where a glass substrate consists essentially of a glass material.

It will be apparent to those skilled in the art that various modifications and variations can be made to the present disclosure without departing from the spirit and scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A protected optical device comprising,
a device structure provided on a substrate,
a hermetic barrier layer formed over at least part of the device structure, and
a light extraction layer, wherein the barrier layer comprises a glass material selected from the group consisting of a tin fluorophosphate glass, a tungsten-doped tin fluorophosphate glass, a chalcogenide glass, a tellurite glass, a borate glass and a phosphate glass and the light extraction layer comprises a matrix material and a scattering layer, the scattering layer selected from the group consisting of scattering particles dispersed throughout the matrix material and a roughened surface.

2. The device according to claim 1, wherein the device structure comprises an organic light emitting diode.

3. The device according to claim 1, wherein the substrate is a flexible substrate.

4. The device according to claim 1, wherein a thickness of the substrate is from 25 microns to 5 mm.

5. The device according to claim 1, wherein a thickness of the harrier layer is from 200 nm to 10 microns.

6. The device according to claim 1, wherein a refractive index of the barrier layer is from 1.4 to 3.

7. The device according to claim 1, wherein the barrier layer comprises a glass material having a glass transition temperature of less than 400° C.

8. The device according to claim 1, wherein the barrier layer comprises a glass material having a softening point of less than 500° C.

9. The device according to claim 1, wherein the barrier layer comprises a glass material including:
20-75 wt. % Sn,
2-20 wt. % P,
10-36 wt. % O,
10-36 wt. % F, and
0-5 wt. % Nb.

10. The device according to claim 1, wherein the barrier layer comprises a glass material including:
55-75 wt. % Sn,
4-14 wt. % P,
6-24 wt. % O,
4-22 wt. % F, and
0.15-15 wt. % W.

11. The device according to claim 1, wherein the light extraction layer is formed over the barrier layer.

12. The device according to claim 1, wherein the light extraction layer is formed over the substrate.

13. The device according to claim 1, wherein the light extraction layer comprises at least a portion of the barrier layer.

14. The device according to claim 1, wherein a thickness of the light extraction layer is from 50 nm to 1 mm.

15. The device according to claim 1, wherein a refractive index of the matrix material is from 1.4 to 3.

16. The device according to claim 1, wherein a refractive index of the barrier layer is substantially equal to a refractive index of the matrix material.

17. The device according to claim 1, wherein the scattering particles comprise a material selected from the group consisting of aluminum oxide, silicon oxide, titanium oxide, zirconium oxide, niobium oxide, zinc oxide, tin oxide, silicon nitride and combinations thereof.

18. The device according to claim 1, wherein the scattering particles are homogeneously distributed throughout the matrix material.

19. The device according to claim 1, wherein the scattering particles occupy from 1 to 75% by volume of the scattering layer.

20. The device according to claim 1, wherein an average size of the scattering particles is from 10 nm to 450 nm.

21. The device according to claim 1, wherein an average rms surface roughness (Rq) of the scattering layer is greater than 50 nm.

22. The device according to claim 1, wherein the barrier layer is optically translucent.

23. The device according to claim 1, wherein the barrier layer is optically transparent.

* * * * *